(12) United States Patent
Vianello et al.

(10) Patent No.: US 11,489,012 B2
(45) Date of Patent: Nov. 1, 2022

(54) METHOD OF PRODUCING A RECURRENT NEURAL NETWORK COMPUTER

(71) Applicant: COMMISSARIAT A L'ENERGIE ATOMIQUE ET AUX ENERGIES ALTERNATIVES, Paris (FR)

(72) Inventors: Elisa Vianello, Grenoble (FR); Catherine Carabasse, Coublevie (FR); Selina La Barbera, Grenoble (FR); Raluca Tiron, Saint-Martin-le-Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 341 days.

(21) Appl. No.: 16/649,906

(22) PCT Filed: Sep. 25, 2018

(86) PCT No.: PCT/FR2018/052348
§ 371 (c)(1),
(2) Date: Mar. 23, 2020

(87) PCT Pub. No.: WO2019/063926
PCT Pub. Date: Apr. 4, 2019

(65) Prior Publication Data
US 2020/0321397 A1  Oct. 8, 2020

(30) Foreign Application Priority Data

Sep. 26, 2017  (FR) ..................... 17 58900
Mar. 6, 2018   (FR) ..................... 18 51910

(51) Int. Cl.
*G06N 3/04*      (2006.01)
*G06N 3/063*     (2006.01)
(Continued)

(52) U.S. Cl.
CPC ....... *H01L 27/2472* (2013.01); *G06N 3/0445* (2013.01); *G06N 3/0635* (2013.01);
(Continued)

(58) Field of Classification Search
CPC ........ G06N 3/0445; G06N 3/06; G06N 3/063; G06N 3/0635; H01L 21/0271;
(Continued)

(56) References Cited

U.S. PATENT DOCUMENTS 10,741,757 B2 *   8/2020   Vianello ............. G06N 3/0445
2008/0064217 A1 *  3/2008   Horii ..................... H01L 45/06
                                                257/E21.257
(Continued)

OTHER PUBLICATIONS

International Search Report dated Mar. 1, 2019 in PCT/FR2018/052348 filed Sep. 25, 2018, 3 pages.

(Continued)

*Primary Examiner* — Herve-Louis Y Assouman
*Assistant Examiner* — Christopher M Roland
(74) *Attorney, Agent, or Firm* — Oblon, McClelland, Maier & Neustadt, L.L.P.

(57) ABSTRACT

A method of producing a recurrent neural network computer includes consecutive steps of providing a substrate with a first electrode; structuring the first electrode by etching using a first mask made of block copolymers, such that said electrode has free regions which are randomly spatially distributed; forming a resistive-RAM-type memory layer on the first structured electrode; forming a second electrode on the memory layer; and structuring the second electrode by (Continued)

etching, using a second mask made of block copolymers such that said electrode has free regions which are randomly spatially distributed.

11 Claims, 4 Drawing Sheets

(51) Int. Cl.
| | |
|---|---|
| *H01L 21/027* | (2006.01) |
| *H01L 27/24* | (2006.01) |
| *H01L 45/00* | (2006.01) |
| *H01L 21/3213* | (2006.01) |
| *H01L 21/32* | (2006.01) |

(52) U.S. Cl.
CPC .......... *H01L 21/0271* (2013.01); *H01L 21/32* (2013.01); *H01L 21/3213* (2013.01); *H01L 45/1253* (2013.01); *H01L 45/16* (2013.01); *H01L 2224/3016* (2013.01); *H01L 2224/3316* (2013.01)

(58) Field of Classification Search
CPC . H01L 21/32; H01L 21/3213; H01L 27/2472; H01L 45/1253; H01L 45/16; H01L 2224/3016; H01L 2224/3316
See application file for complete search history.

(56) References Cited

U.S. PATENT DOCUMENTS

| | | | |
|---|---|---|---|
| 2009/0042146 A1* | 2/2009 | Kim .................... | B81C 1/00031 430/323 |
| 2009/0191713 A1* | 7/2009 | Yoon .................... | G03F 7/0002 257/E21.249 |
| 2010/0220523 A1 | 9/2010 | Modha et al. | |
| 2014/0214738 A1 | 7/2014 | Pickett | |
| 2015/0179434 A1* | 6/2015 | Ban .................... | H01L 21/0271 428/179 |
| 2015/0379395 A1 | 12/2015 | Pickett | |
| 2018/0375670 A1* | 12/2018 | May ........................ | G06F 21/44 |
| 2020/0052037 A1* | 2/2020 | Kong .................... | H01L 45/147 |
| 2021/0367149 A1* | 11/2021 | Tiron .................... | G06N 3/0445 |

OTHER PUBLICATIONS

Demis et al., "Atomic switch networks-nanoarchitectonic design of a complex system for natural computing." Nanotechnology, vol. 26, Apr. 27, 2015, pp. 1-11, XP020283967.

Frascaroli et al., "Resistive Switching in High-Density Nanodevices Fabricated bv Block Copolymer Self-Assembly," ACS NANO, vol. 9, No. 3, Mar. 5, 2015, pp. 2518-2529, XP055491697.

* cited by examiner

METHOD OF PRODUCING A RECURRENT NEURAL NETWORK COMPUTER

TECHNICAL FIELD

The invention relates to the technical field of recurrent-neural-network computers. Recurrent neural networks are networks of artificial neurons in which the connections between the units form at least one cycle in the sense of graph theory. More precisely, the technical domain relates to recurrent neural networks trained using the reservoir-computing paradigm. This paradigm is a highly nonlinear dynamic system, comprising:
  an input layer;
  a hidden layer, called the reservoir, which is provided with recurrent connections that are randomly fixed;
  an output layer (or readout).

The principle of this paradigm is to project the input layer onto the reservoir, then to modify the connections between the reservoir and the output layer via supervised learning.

In other words, the invention relates to a computer that is a physical or hardware implementation of the reservoir-computing paradigm.

The invention is notably applicable to classifying tasks, extracting features, tracking objects, predicting movements in robotics, voice recognition and sound recognition.

PRIOR ART

One process for fabricating a recurrent-neural-network computer that is known in the prior art, notably from the document "Atomic switch networks—nanoarchitectonic design of a complex system for natural computing", E. C. Demis et al., Nanotechnology, 26, 204003, 2015, comprises a step of randomly growing silver nanowires on a structured platinum electrode. The random character is obtained via a prior step of forming copper microspheres on the structured electrode. The copper microspheres form a seed layer for the silver nanowires. The process comprises a step of sulfurizing the silver nanowires so as to obtain $Ag/Ag_2S/Ag$ structures. Such structures form resistive atomic-switch memory cells.

Such a prior-art process allows a computer that is a physical implementation of the reservoir-computing paradigm to be fabricated. However, such a prior-art process is not entirely satisfactory insofar as the choice of materials from which the resistive memory may be made is restricted. Specifically, it is necessary to choose a compatible pair of materials, i.e. a compatible electrical conductor/dielectric, in the present case $Ag/Ag_2S$, to form the nanowires and the resistive memory cells.

SUMMARY OF THE INVENTION

The invention aims to remedy all or some of the aforementioned drawbacks. To this end, one subject of the invention is a process for fabricating a recurrent-neural-network computer, comprising the successive steps of:
  a) providing a substrate comprising a first electrode;
  b) forming a first block-copolymer layer on one portion of the first electrode so that the first electrode contains free zones with a random spatial distribution;
  c) etching the free zones of the first electrode so as to structure the first electrode;
  d) removing the first block-copolymer layer;
  e) forming a resistive random-access memory layer on the first electrode structured in step c);
  f) forming a second electrode on the memory layer;
  g) forming a second block-copolymer layer on one portion of the second electrode so that the second electrode contains free zones with a random spatial distribution;
  h) etching the free zones of the second electrode so as to structure the second electrode;
  i) removing the second block-copolymer layer.

Thus, such a process according to the invention allows the physical implementation of a recurrent-neural-network computer able to be trained using the reservoir-computing paradigm. Specifically, the block copolymers possess the property of self-assembling into dense networks of nanoscale objects with the capacity to form a lithography mask.

This self-assembly introduces the random character required in the reservoir-computing paradigm, i.e., for example:
  recurrent connections randomly fixed in the reservoir;
  a stochastic number of units (one unit corresponding to one resistive random-access memory cell, located at an intersection between the first and second electrodes);
  a random latency time between the units (e.g. a random distance between the units);
  a random weight of the units via a random conductance of the cells of the resistive memory (the cells of the resistive memory being formed by the zones of intersection between the memory layer and the first and second electrodes).

Furthermore, the lithography mask thus formed by the first and second block-copolymer layers allows the first and second electrodes to be structured in steps c) and h).

Lastly, such a process according to the invention permits freedom in the choice of the material of the memory layer insofar as the memory layer is formed independently of the first and second block-copolymer layers.

Definitions
  By "structured electrode" what is meant is an electrode having a discontinuous surface delineating a set of patterns.
  By "free zones" what is meant is zones of the electrode that are not covered with the block-copolymer layer.
  By "memory layer" what is meant is a layer or a plurality of sub-layers (for example made from an oxide material or a chalcogenide material) forming, with the first and second electrodes, a resistive random-access memory (ReRAM). More precisely, the cells of the resistive random-access memory cells are located at the intersections between the first and second electrodes.

The process according to the invention may comprise one or more of the following features.

According to one feature of the invention, step b) comprises the successive steps of:
  $b_1$) forming a layer of a random polymer on the first electrode;
  $b_2$) grafting the random-polymer layer to one portion of the first electrode;
  $b_3$) forming the first block-copolymer layer on the random-polymer layer grafted in step $b_2$);
  $b_4$) removing the grafted random-polymer layer.

By "random polymer" what is meant is a polymer possessing a random coil.

Thus, the random-polymer layer is a functionalization layer allowing the surface energies of the first electrode to be controlled. One procured advantage is accentuation of the random character and improvement of the quality of the formation of the first block-copolymer layer.

According to one feature of the invention, step g) comprises the successive steps of:
  $g_1$) forming a layer of a random polymer on the second electrode;
  $g_2$) grafting the random-polymer layer to one portion of the second electrode;
  $g_3$) forming the second block-copolymer layer on the random-polymer layer grafted in step $g_2$);
  $g_4$) removing the grafted random-polymer layer.

Thus, the random-polymer layer is a functionalization layer allowing the surface energies of the second electrode to be controlled. One procured advantage is accentuation of the random character and improvement of the quality of the formation of the second block-copolymer layer.

According to one feature of the invention, the random polymer is selected from the group containing a statistical copolymer, a homopolymer, a self-assembled monolayer.

According to one feature of the invention, the block copolymers of the first layer and second layer are selected from the group containing;
  polystyrene and polymethyl methacrylate, denoted PS-PMMA;
  polystyrene and polylactic acid, denoted PS-PLA;
  polystyrene and poly(ethylene oxide), denoted PS-PEO;
  polystyrene and polydimethylsiloxane, denoted PS-PDMS;
  polystyrene, polymethyl methacrylate and poly(ethylene oxide), denoted PS-PMMA-PEO,
  polystyrene and poly(2-vinyl pyridine), denoted PS-P2VP.

According to one feature of the invention, the memory layer is made from at least one material selected from the group containing $HfO_2$, $Al_2O_3$, $SiO_2$, ZrO, a titanium oxide, a chalcogenide, $Ta_2O_5$.

According to one feature of the invention, the first and second electrodes are made from at least one material selected from the group containing Ti, TiN, Pt, Zr, Al, Hf, Ta, TaN, C, Cu, Ag.

According to one feature of the invention, the first block-copolymer layer and the second block-copolymer layer formed in steps b) and g) have a thickness comprised between 30 nm and 50 nm, respectively.

Thus, one procured advantage is to obtain a lithography mask of good quality for structuring the first and second electrodes.

According to one feature of the invention, the process comprises a step j) consisting in forming an encapsulation layer on the second electrode structured in step h), step j) being executed after step i).

Thus, one procured advantage is to protect the computer from air and moisture.

According to one feature of the invention, the first electrode structured in step c) has a pitch, denoted p, and step e) is executed so that the memory layer has a thickness, denoted E, respecting:

$p/2 \leq E \leq p$.

Thus, such a thickness E of the memory layer allows an almost planar surface topology to be obtained so as to facilitate the formation of the second electrode in step f), while avoiding the need for a step of chemical-mechanical polishing.

Another subject of the invention is a recurrent-neural-network computer obtained using a process according to the invention.

BRIEF DESCRIPTION OF THE DRAWINGS

Other features and advantages will become apparent from the detailed description of various embodiments of the invention, the description being coupled with examples and references to the appended drawings.

It will be noted that the drawings described above are schematic and not to scale for the sake of legibility.

DETAILED DESCRIPTION OF EMBODIMENTS

In the various embodiments, elements that are identical or that perform the same function have been designated with the same references for the sake of simplicity.

Figure 1A:
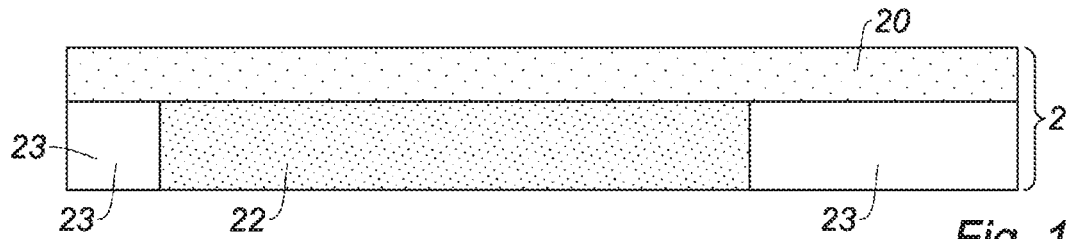
FIGS. 1a to 1h are schematic cross-sectional views illustrating various steps of a process according to the invention, the cross section being cut normal to the surface of the substrate.
Figure 1B:
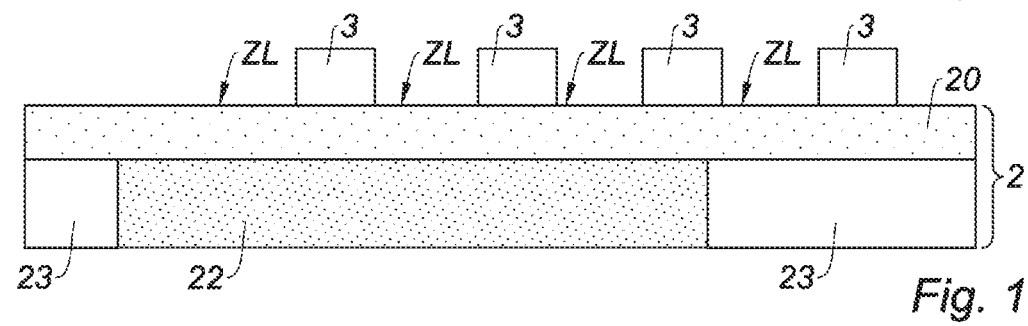
Figure 1C:
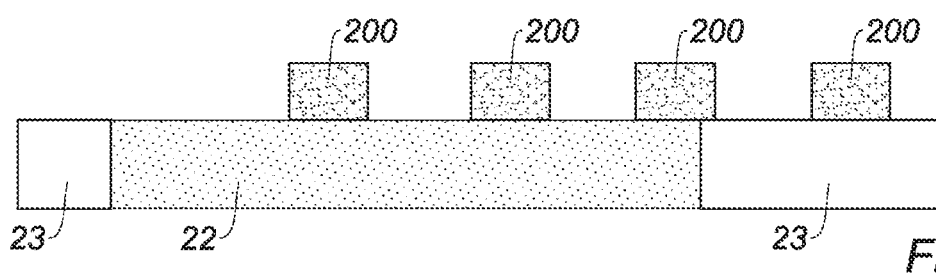
Figure 1D:
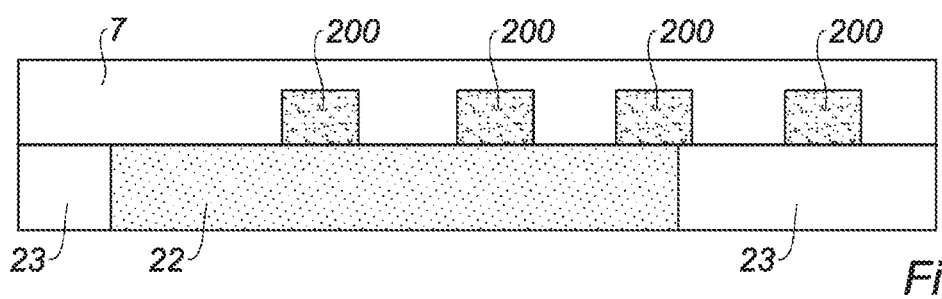
Figure 1E:
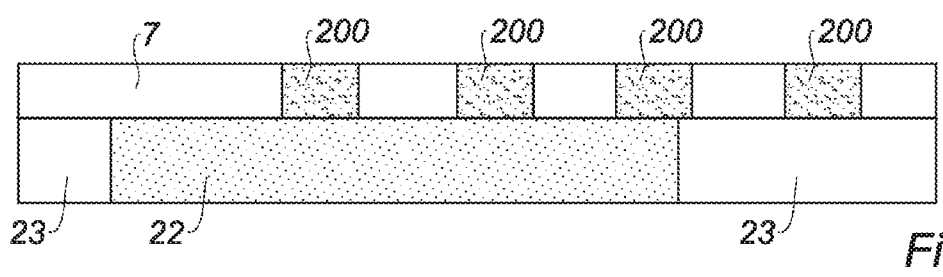
Figure 1F:
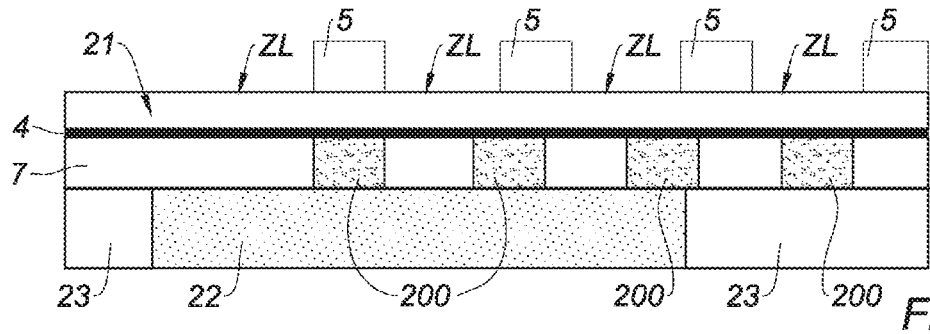
Figure 1G:
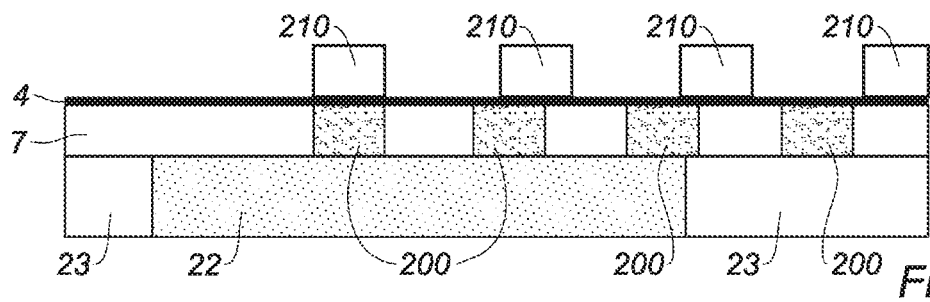

One subject of the invention is a process for fabricating a recurrent-neural-network computer 1 comprising the successive steps of:
  a) providing a substrate 2 comprising a first electrode 20 (illustrated in FIG. 1a);
  b) forming a first block-copolymer layer 3 on one portion of the first electrode 20 so that the first electrode 20 contains free zones ZL with a random spatial distribution (illustrated in FIG. 1b);
  c) etching the free zones of the first electrode 20 so as to structure the first electrode 20;
  d) removing the first block-copolymer layer 3 (the situation at the end of step d) is illustrated in FIG. 1c);
  e) forming a resistive random-access memory layer 4 on the first electrode 200 structured in step e);
  f) forming a second electrode 21 on the memory layer 4;
  g) forming a second block-copolymer layer 5 on one portion of the second electrode 21 so that the second electrode 21 contains free regions ZL with a random spatial distribution (the situation at the end of step g) is illustrated in FIG. 1f);
  h) etching the free regions ZL of the second electrode 21 so as to structure the second electrode 21;
  i) removing the second block-copolymer layer 5 (the situation at the end of step i) is illustrated in FIG. 1g).

Substrate

The first electrode 20 is advantageously made from at least one material selected from the group containing Ti, TiN, Pt, Zr, Al, Hf, Ta, TaN, C, Cu, Ag. The first electrode 20 may be made from an alloy of these materials. The first electrode 20 preferably has a thickness comprised between 3 nm and 100 nm. By way of nonlimiting example, the first electrode 20 may be formed on the substrate 2 by physical vapor deposition (PVD), chemical vapor deposition (CVD), or even atomic layer deposition (ALD).

The substrate 2 preferably comprises a metallization layer 22 (for contact redistribution) and a layer of an oxide 23 such as $SiO_2$ or SiN. By way of nonlimiting example, the metallization layer 22 may be a Ti (10 nm)/AlCu (440 nm)/Ti (10 nm)/TiN (100 nm) structure.

Forming the First Block-Copolymer Layer

Step b) advantageously comprises the successive steps of:
  $b_1$) forming a layer of a random polymer on the first electrode;
  $b_2$) grafting the random-polymer layer to one portion of the first electrode;

b$_3$) forming the first block-copolymer layer 3 on the random-polymer layer grafted in step b$_2$);

b$_4$) removing the grafted random-polymer layer.

The random polymer of the layer formed in step b$_1$) is advantageously selected from the group containing a statistical copolymer, a homopolymer, a self-assembled monolayer. The random polymer is advantageously chosen in step b$_1$) so that the force of attraction between each of the monomer blocks of the block copolymer and the random-polymer layer (i.e. the functionalization layer) are equivalent.

Step b$_2$) may be executed using a heat treatment, such as a thermal anneal, or by light-induced cross-linking. The random-polymer layer that was not grafted in step b$_2$) is preferably removed using a wet process.

The first block-copolymer layer 3 formed in step b$_3$) is preferably structured using a thermal anneal.

By way of example, step b$_4$) may be a selective removal when the random polymer and the block copolymer of the first layer 3 possess two phases. Step b$_4$) may be executed using a UV treatment followed by a wet development process. Step b$_4$) may also be executed using a plasma etch.

The block copolymers of the first layer 3 are advantageously selected from the group containing:
- polystyrene and polymethyl methacrylate, denoted PS-PMMA;
- polystyrene and polylactic acid, denoted PS-PLA;
- polystyrene and poly(ethylene oxide), denoted PS-PEO;
- polystyrene and polydimethylsiloxane, denoted PS-PDMS;
- polystyrene, polymethyl methacrylate and poly(ethylene oxide), denoted PS-PMMA-PEO,
- polystyrene and poly(2-vinyl pyridine), denoted PS-P2VP.

By way of example, when the block copolymers of the first layer 3 are polystyrene-b-poly(methyl methacrylate), denoted PS-b-PMMA, of lamellar form, the random polymer of the functionalization layer is advantageously polystyrene-r-poly(methyl methacrylate), denoted PS-r-PMMA, preferably containing 50% by weight of PS and 50% by weight of PMMA. The step b$_1$) is preferably executed by spin coating. The spin coating may be executed by diluting the random polymer in an organic solvent. When the random polymer is PS-r-PMMA, the organic solvent may be propylene glycol methyl ether acetate (PGMEA). The solution of the random polymer diluted in the organic solvent may have a concentration by weight of about 1.5%. Step b$_2$) may be executed using a thermal anneal at a temperature of about 250° C. for a time of about 10 minutes. The thermal anneal may be executed on a hot plate or in a furnace. When the random polymer is able to be cross-linked, such a thermal anneal allows the random polymer to be cross-linked. Step b$_2$) may comprise a rinsing step in which the surplus of random polymer is removed using a solvent. When the random polymer is PS-r-PMMA, the solvent is preferably PGMEA. Step b$_3$) is preferably executed by spin coating. The spin coating may be executed by diluting the block copolymer in an organic solvent. When the block copolymer is PS-b-PMMA, the organic inorganic solvent may be PGMEA. The solution of block copolymer diluted in the organic solvent may have a concentration by weight of about 1.5%. Step b$_3$) is advantageously followed by a thermal anneal allowing self-assembly of the PS-b-PMMA block copolymer and the selective removal of the PS-r-PMMA. The thermal anneal is preferably executed at a temperature of about 250° C. for a time of about 10 minutes.

The first block-copolymer layer 3 formed in step b) advantageously has a thickness comprised between 30 nm and 50 nm.

Structuring of the First Electrode

Step c) is preferably executed using a plasma etch. By way of nonlimiting examples, it is possible to use as gas O$_2$, Ar, COH$_2$, N$_2$H$_2$. Step c) may also be executed using a UV treatment followed by a wet development process (e.g. in acetic acid).

Removal of the First Block-Copolymer Layer

Step d) is preferably executed using a UV treatment followed by a wet development process. Step d) may also be executed using a plasma etch.

Formation of the Memory Layer the memory layer 4 is advantageously made from at least one material selected from the group containing HfO$_2$, Al$_2$O$_3$, SiO$_2$, ZrO, a titanium oxide, a chalcogenide, Ta$_2$O$_5$. The memory layer 4 may be formed from a plurality of sub-layers made from these materials. By way of nonlimiting examples, the chalcogenide may be GeSe or GeSbTe.

The memory layer 4 advantageously has a thickness smaller than or equal to 10 nm.

Formation of the Second Electrode the second electrode 21 is advantageously made from at least one material selected from the group containing Ti, TiN, Pt, Zr, Al, Hf, Ta, TaN, C, Cu, Ag. The second electrode 21 may be made from an alloy of these materials. The second electrode 21 preferably has a thickness comprised between 3 nm and 100 nm. By way of nonlimiting examples, the second electrode 21 may be formed on the memory layer 4 by physical vapor deposition (PVD), chemical vapor deposition (CVD), or even by atomic layer deposition (ALD).

Formation of the Second Block-Copolymer Layer

Step g) advantageously comprises the successive steps of:

g$_1$) forming a layer of a random polymer on the second electrode;

g$_2$) grafting the random-polymer layer to one portion of the second electrode;

g$_3$) forming the second block-copolymer layer 5 on the random-polymer layer grafted in step g$_2$);

g$_4$) removing the grafted random-polymer layer.

The random polymer of the layer formed in step g$_1$) is advantageously selected from the group containing a statistical copolymer, a homopolymer, a self-assembled monolayer. The random polymer is advantageously chosen in step g$_1$) so that the force of attraction between each of the monomer blocks of the block copolymer and the random-polymer layer (i.e. the functionalization layer) are equivalent.

Step g$_2$) may be executed using a heat treatment, such as a thermal anneal, or by light-induced cross-linking. The random-polymer layer that was not grafted in step b$_2$) is preferably removed using a wet process.

The second block-copolymer layer 5 formed in step g$_3$) is preferably structured using a thermal anneal.

By way of example, step g$_4$) may be a selective removal when the random polymer and the block copolymer of the second layer 5 possess two phases. Step g$_4$) may be executed using a UV treatment followed by a wet development process. Step g$_4$) may also be executed using a plasma etch.

The block copolymers of the second layer 5 are advantageously selected from the group containing:
- polystyrene and polymethyl methacrylate, denoted PS-PMMA;
- polystyrene and polylactic acid, denoted PS-PLA;
- polystyrene and poly(ethylene oxide), denoted PS-PEO;

polystyrene and polydimethylsiloxane, denoted PS-PDMS;

polystyrene, polymethyl methacrylate and poly(ethylene oxide), denoted PS-PMMA-PEO, polystyrene and poly(2-vinyl pyridine), denoted PS-P2VP.

By way of example, when the block copolymers of the second layer 5 are polystyrene-b-poly(methyl methacrylate), denoted PS-b-PMMA, of lamellar form, the random polymer of the functionalization layer is advantageously polystyrene-r-poly(methyl methacrylate), denoted PS-r-PMMA, preferably containing 50% by weight of PS and 50% by weight of PMMA. The step $g_1$) is preferably executed by spin coating. The spin coating may be executed by diluting the random polymer in an organic solvent. When the random polymer is PS-r-PMMA, the organic solvent may be propylene glycol methyl ether acetate (PGMEA). The solution of the random polymer diluted in the organic solvent may have a concentration by weight of about 1.5%. Step $g_2$) may be executed using a thermal anneal at a temperature of about 250° C. for a time of about 10 minutes. The thermal anneal may be executed on a hot plate or in a furnace. When the random polymer is able to be cross-linked, such a thermal anneal allows the random polymer to be cross-linked. Step $g_2$) may comprise a rinsing step in which the surplus of random polymer is removed using a solvent. When the random polymer is PS-r-PMMA, the solvent is preferably PGMEA. Step $g_3$) is preferably executed by spin coating. The spin coating may be executed by diluting the block copolymer in an organic solvent. When the block copolymer is PS-b-PMMA, the organic solvent may be PGMEA. The solution of block copolymer diluted in the organic solvent may have a concentration by weight of about 1.5%. Step $g_3$) is advantageously followed by a thermal anneal allowing self-assembly of the PS-b-PMMA block copolymer and the selective removal of the PS-r-PMMA. The thermal anneal is preferably executed at a temperature of about 250° C. for a time of about 10 minutes.

The second block-copolymer layer 5 formed in step g) advantageously has a thickness comprised between 30 nm and 50 nm.

Structuring of the Second Electrode

Step h) is preferably executed using a plasma etch. By way of nonlimiting examples, it is possible to use as gas $O_2$, Ar, $COH_2$, $N_2H_2$. Step h) may also be executed using a UV treatment followed by a wet development process (e.g, in acetic acid).

Removal of the Second Block-Copolymer Layer

Step i) is preferably executed using a UV treatment followed by a wet development process. Step i) may also be executed using a plasma etch.

Encapsulation

Figure 1H:
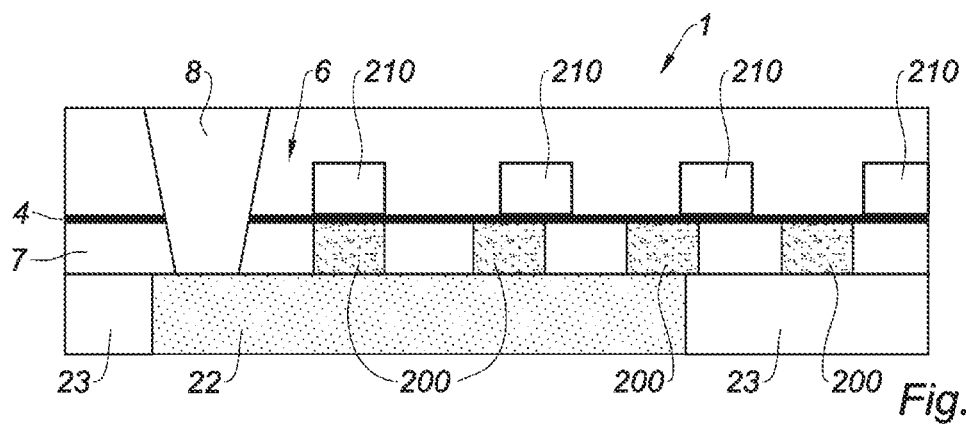
Figure 2:
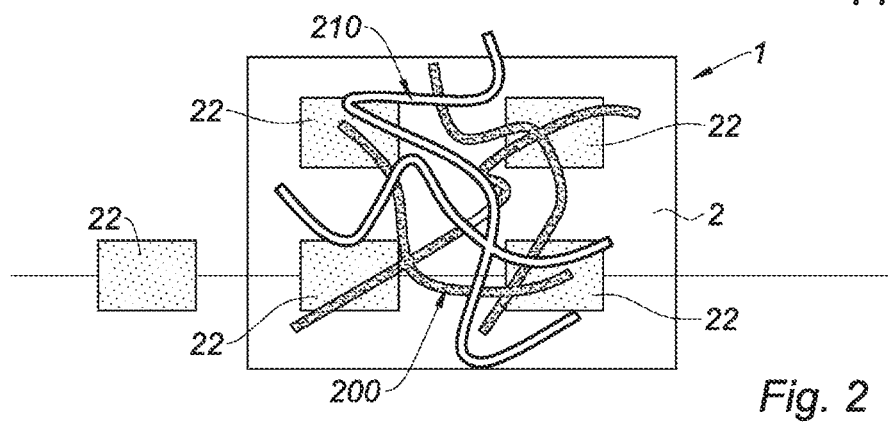
FIG. 2 is a schematic top view of a computer obtained using a process according to the invention.

As illustrated in FIG. 1h, the process advantageously comprises a step j) consisting in forming an encapsulation layer 6 on the second electrode 210 structured in step h), step j) being executed after step i). The encapsulation layer 6 is preferably a layer of an oxide such as $SiO_2$ or SiN.

Moreover, as illustrated in FIG. 1d, the process advantageously comprises a step $d_1$) consisting in forming an encapsulation layer 7 on the structured first electrode 200. Step $d_1$) is executed after step d) before step e). The encapsulation layer 7 is preferably a layer of an oxide such as $SiO_x$ or SiN. Step $d_1$) is advantageously followed by a step $d_2$) of planarizing the encapsulation layer 7, which may be executed by chemical-mechanical polishing (CMP). In the absence of steps $d_1$) and $d_2$), the memory layer 4 formed in step e) follows the topology of the structured first electrode 200.

Figure 3A:
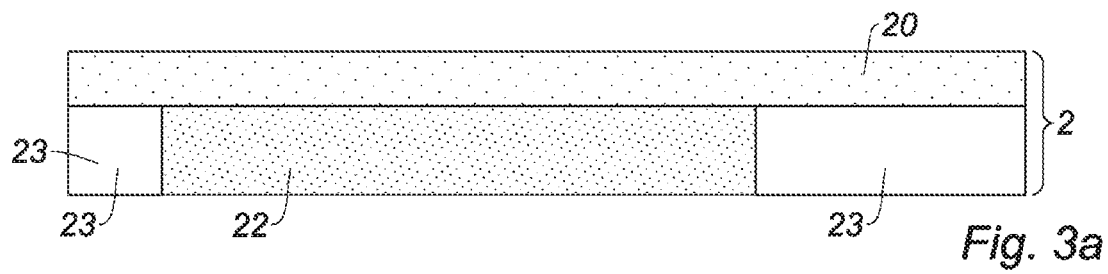
FIGS. 3a to 3g are schematic cross-sectional views illustrating various steps of a process according to the invention, the cross section being cut normal to the surface of the substrate.
Figure 3B:
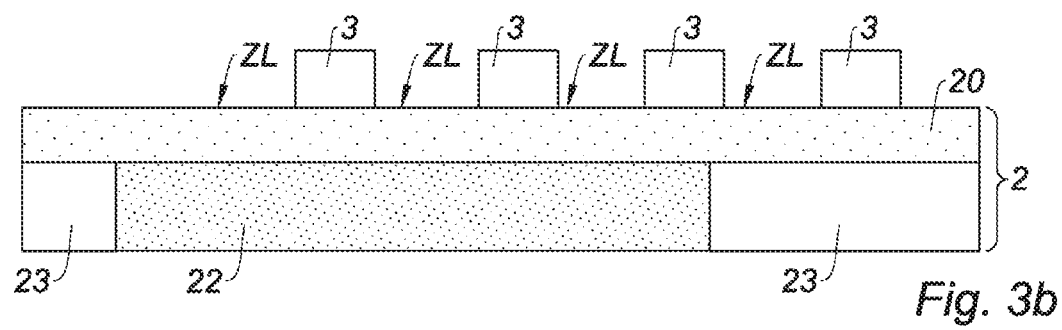
Figure 3C:
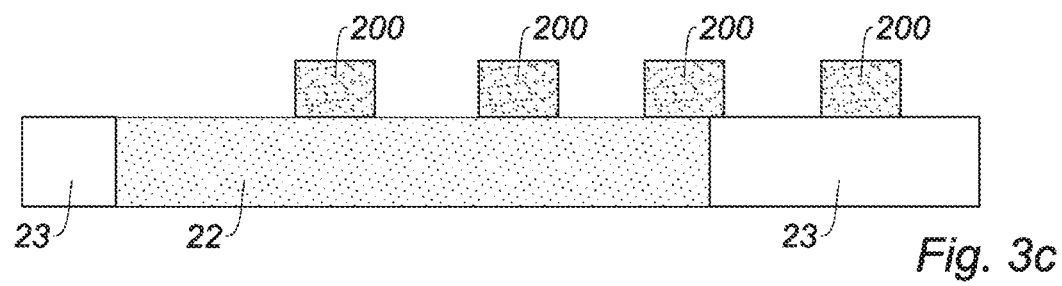
Figure 3D:
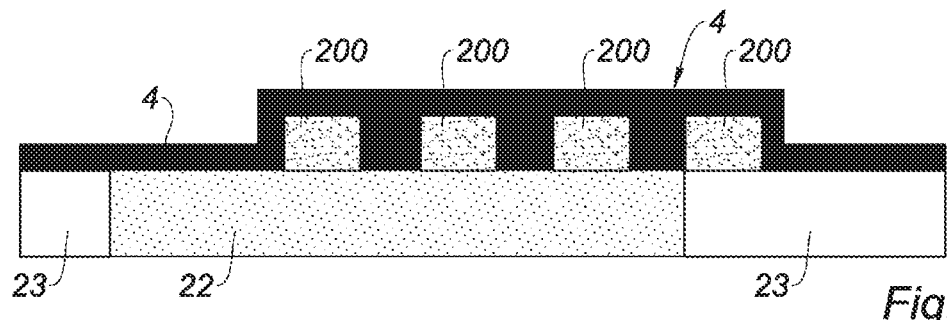
Figure 3E:
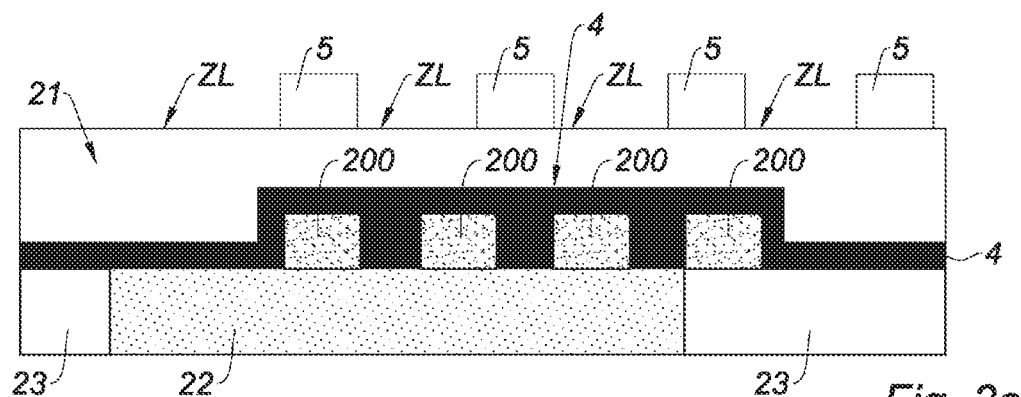
Figure 3F:
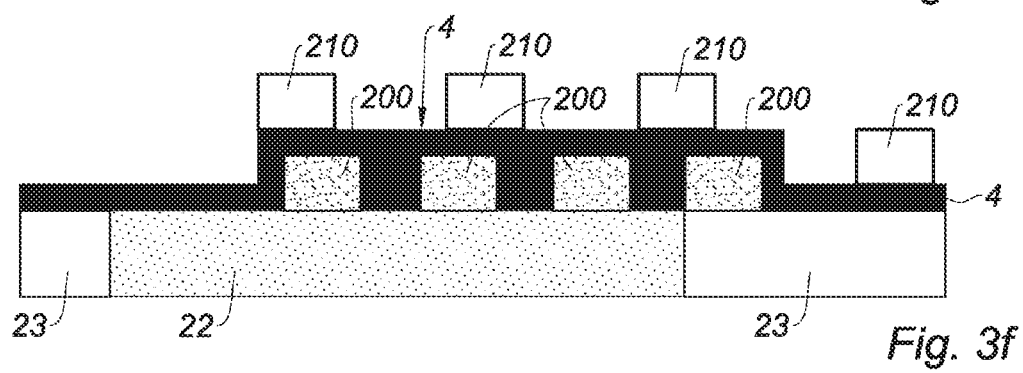
Figure 3G:
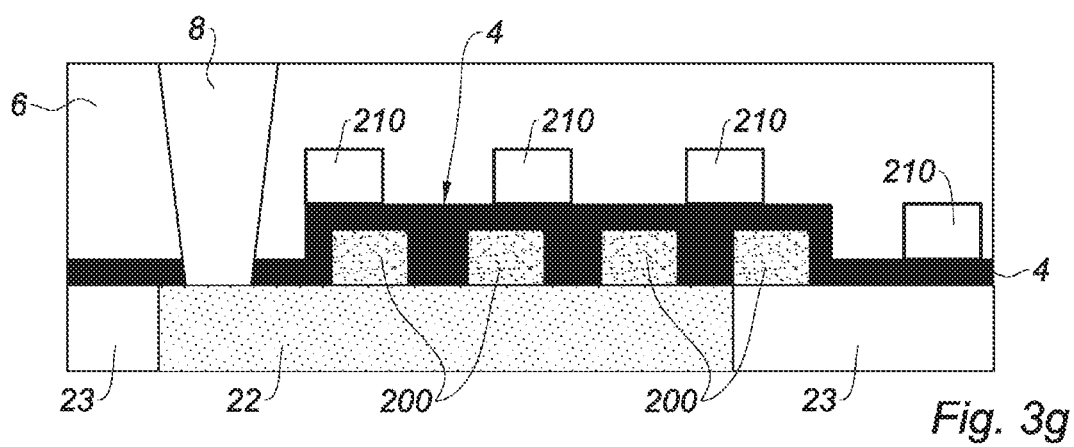

More precisely, as illustrated in FIGS. 3a to 3g, in the absence of steps $d_1$) and $d_2$), the memory layer 4 is formed in step e) directly on the substrate 2 and directly on the structured first electrode 200 and follows the topology of the structured first electrode 200 (see FIG. 3d). This embodiment is particularly advantageous because it notably allows step $d_2$) of chemical-mechanical polishing, which may prove to be tricky to carry out because of the geometry of the structured first electrode 200 (the ratio between its thickness and its pitch being low) to be avoided.

In the absence of steps $d_1$) and $d_2$), the memory layer 4 formed in step d) advantageously has a thickness, denoted E, respecting:

$$p/2 \leq E \leq p$$

where p is the pitch of the structured first electrode 200 forming a periodic structure. Such a thickness E of the memory layer 4 allows an almost planar surface topology to be obtained so as to facilitate the formation of the second electrode 21 in step f) (illustrated in FIG. 3e).

The pitch p of the structured first electrode 200 corresponds to the pitch of the first block-copolymer layer 3 formed in step b). By way of nonlimiting example, when the first block-copolymer layer 3 formed in step b) is made of PS-PMMA, the pitch of said first layer 3 is defined by the molar mass of the block copolymer, as mentioned in the document by Kim et al, "Directed assembly of high molecular weight block polymers: highly ordered line patterns of perpendicularly oriented lamellae with large periods:", ACS Nano, 7 (3), pp. 1952-60, 2013. The molar mass of the first block-copolymer layer 3 formed in step b) will therefore possibly be chosen so as to control the pitch p of the structured first electrode 200. By way of nonlimiting example, the pitch p of the structured first electrode 200 may be about 20 nm.

In the absence of steps $d_1$) and $d_2$), the memory layer 4 is advantageously made from at least one material selected from the group containing:

$HfO_x$, x<2;
$Al_2O_x$, x<3;
$SiO_x$, x<2;
$ZrO_x$, x<3,
$TiO_x$, x<2,
$Ta_2O_x$, x<5.

Such materials are sub-stoichiometric oxides allowing an electrically conductive filament to be created when they are subjected to a high potential difference. Such materials may thus form, with the first and second structured electrodes 200, 210, a resistive random-access memory.

Electrical Contacts

As illustrated in FIG. 1h, the process preferably comprises a step k) consisting in forming an electrical contact pad 8, making contact with the metallization layer 22. The step k) is executed after the step j). The step k) comprises a step of etching the encapsulation layer 6 formed on the structured second electrode 210.

The invention is not limited to the described embodiments. Those skilled in the art will be able to consider technically functional combinations thereof, and to substitute equivalents therefor.

The invention claimed is:

1. A process for fabricating a recurrent-neural-network computer, comprising the successive steps of:
   a) providing a substrate having a first electrode;
   b) forming a first block-copolymer layer on one portion of the first electrode so that the first electrode contains free zones with a random spatial distribution;
   c) etching the free zones of the first electrode so as to structure the first electrode;
   d) removing the first block-copolymer layer;
   e) forming a resistive random-access memory layer on the first electrode structured in step c);
   f) forming a second electrode on the memory layer;
   g) forming a second block-copolymer layer on one portion of the second electrode so that the second electrode contains free zones with a random spatial distribution;
   h) etching the free zones of the second electrode so as to structure the second electrode; and
   i) removing the second block-copolymer layer.

2. The process as claimed in claim 1, wherein step b) comprises the successive steps of:
   b1) forming a layer of a random polymer on the first electrode;
   b2) grafting the layer of the random polymer to the one portion of the first electrode;
   b3) forming the first block-copolymer layer on the layer of the random polymer grafted in step b2); and
   b4) removing the layer of the random polymer grafted in step b2).

3. The process as claimed in claim 2, wherein the random polymer is selected from the group comprising a statistical copolymer, a homopolymer, and a self-assembled monolayer.

4. The process as claimed in claim 1, wherein step g) comprises the successive steps of:
   g1) forming a layer of a random polymer on the second electrode;
   g2) grafting the layer of the random polymer to the one portion of the second electrode;
   g3) forming the second block-copolymer layer on the layer of the random polymer grafted in step g2); and
   g4) removing the layer of the random polymer grafted in step g2).

5. The process as claimed in claim 1, wherein the block copolymers of the first layer and of the second layer are selected from the group comprising:
   polystyrene and polymethyl methacrylate, denoted PS-PMMA;
   polystyrene and polylactic acid, denoted PS-PLA;
   polystyrene and poly(ethylene oxide), denoted PS-PEO;
   polystyrene and polydimethylsiloxane, denoted PS-PDMS;
   polystyrene, polymethyl methacrylate and poly(ethylene oxide), denoted PS-PMMA-PEO; and
   polystyrene and poly(2-vinyl pyridine), denoted PS-P2VP.

6. The process as claimed in claim 1, wherein the memory layer is made from at least one material selected from the group comprising $HfO_2$, $Al_2O_3$, $SiO_2$, ZrO, a titanium oxide, a chalcogenide, and $Ta_2O_5$.

7. The process as claimed in claim 1, wherein the first and second electrodes are made from at least one material selected from the group comprising Ti, TiN, Pt, Zr, Al, Hf, Ta, TaN, C, Cu, and Ag.

8. The process as claimed in claim 1, wherein the first block-copolymer layer and the second block-copolymer layer formed in steps b) and g), respectively, each has a thickness comprised between 30 nm and 50 nm.

9. The process as claimed in claim 1, comprising a step j) of forming an encapsulation layer on the second electrode structured in step h), step j) being executed after step i).

10. The process as claimed in claim 1, wherein the first electrode structured in step c) has a pitch, denoted p, and wherein step e) is executed so that the memory layer has a thickness, denoted F, respecting:

$$p/2 \leq F \leq p.$$

11. A recurrent-neural-network computer obtained using the process as claimed in claim 1.

* * * * *